US011573490B2

(12) United States Patent
Kim et al.

(10) Patent No.: US 11,573,490 B2
(45) Date of Patent: Feb. 7, 2023

(54) POSITIVE-TYPE PHOTOSENSITIVE RESIN COMPOSITION AND CURED FILM PREPARED THEREFROM

(71) Applicant: ROHM AND HAAS ELECTRONIC MATERIALS KOREA LTD., Chungcheongnam-do (KR)

(72) Inventors: Ji Ung Kim, Gyeonggi-do (KR); Geun Huh, Gyeonggi-do (KR); Ju-Young Jung, Gyeonggi-do (KR); JinKyu Im, Gyeonggi-do (KR); Yeonok Kim, Gyeonggi-do (KR)

(73) Assignee: Rohm and Haas Electronic Materials Korea Ltd.

( * ) Notice: Subject to any disclaimer, the term of this patent is extended or adjusted under 35 U.S.C. 154(b) by 0 days.

(21) Appl. No.: 16/879,160

(22) Filed: May 20, 2020

(65) Prior Publication Data

US 2020/0409266 A1 Dec. 31, 2020

(30) Foreign Application Priority Data

Jun. 28, 2019 (KR) .......................... 10-2019-0078179

(51) Int. Cl.
| | | |
|---|---|---|
| *G03F 7/023* | (2006.01) | |
| *G03F 7/022* | (2006.01) | |
| *G03F 7/075* | (2006.01) | |
| *G03F 7/027* | (2006.01) | |
| *G03F 7/033* | (2006.01) | |

(52) U.S. Cl.
CPC .......... *G03F 7/0226* (2013.01); *G03F 7/027* (2013.01); *G03F 7/0233* (2013.01); *G03F 7/033* (2013.01); *G03F 7/0757* (2013.01)

(58) Field of Classification Search
CPC .... G03F 7/0233; G03F 7/0757; G03F 7/0226; G03F 7/027; G03F 7/033
See application file for complete search history.

(56) References Cited

U.S. PATENT DOCUMENTS

| | | | | |
|---|---|---|---|---|
| 7,374,856 B2* | 5/2008 | Suwa | ..................... | G03F 7/0757 |
| | | | | 430/169 |
| 8,647,810 B2* | 2/2014 | Nakahara | .............. | C08F 224/00 |
| | | | | 526/268 |
| 9,395,627 B2* | 7/2016 | Liu | ........................ | G03F 7/0757 |
| 2018/0095365 A1* | 4/2018 | Kim | ....................... | G03F 7/0233 |

FOREIGN PATENT DOCUMENTS

| | | | | |
|---|---|---|---|---|
| WO | 2009028360 A1 | | 3/2009 | |
| WO | WO-2009028360 A1 * | | 3/2009 | ........... G03F 7/0233 |

* cited by examiner

*Primary Examiner* — John S Chu
(74) *Attorney, Agent, or Firm* — G. Creston Campbell (57) ABSTRACT

The present invention relates to a positive-type photosensitive resin composition and a cured film prepared therefrom. The positive-type photosensitive resin composition comprises a nonpolar organic solvent, thereby suppressing the reactivity of the epoxy group in the composition to reduce the production of diol compounds. When a cured film is prepared from the composition, an appropriate level of developability can be maintained to further enhance the pattern adhesiveness, resolution, and sensitivity. Further, since the composition of the present invention has a small difference in the film retention rates at room temperature and low temperatures, the composition may have stable stability over time.

13 Claims, 2 Drawing Sheets

POSITIVE-TYPE PHOTOSENSITIVE RESIN COMPOSITION AND CURED FILM PREPARED THEREFROM

TECHNICAL FIELD

The present invention relates to a positive-type photosensitive resin composition capable of forming a cured film that is excellent in film retention rate and pattern adhesiveness over time, and a cured film prepared therefrom to be used in a liquid crystal display, an organic EL display, and the like.

BACKGROUND ART

Generally, a transparent planarization film is formed on a thin film transistor (TFT) substrate for the purpose of insulation to prevent a contact between a transparent electrode and a data line in a liquid crystal display or an organic EL display. Through a transparent pixel electrode positioned near the data line, the aperture ratio of a panel may be increased, and high luminance/resolution may be attained.

In order to form such a transparent planarization film, several processing steps are employed to impart a specific pattern profile, and a positive-type photosensitive resin composition is widely employed in this process since fewer processing steps are required. In particular, as the size of LCD panels increases, there is an increasing demand for positive cured films without stitch mura and lens mura.

In connection with the conventional positive-type photosensitive resin compositions, technologies of using a polysiloxane resin, an acrylic resin, and the like as raw materials have been introduced.

As compared with a polysiloxane resin that is rich in silanol groups, an acrylic resin has a problem that its sensitivity is lower than that of the polysiloxane resin since the content of carboxyl groups involved in development is limited. In order to compensate this, a photosensitive resin composition and a cured film prepared therefrom have been proposed in which a polysiloxane resin and an acrylic resin are employed together, thereby having excellent sensitivity and adhesiveness (see Japanese Patent No. 5,099,140).

However, the sensitivity has not yet been improved to a satisfactory level. In addition, in the conventional technologies in which a polysiloxane resin and an acrylic resin are used as a binder, new problems have arisen that the diol compounds produced by the reaction between the epoxy groups in the acrylic resin and the $H_2O$ molecules in the polysiloxane resin result in a poor pattern and deterioration in the adhesion to a substrate.

In recent years, attempts have been made to resolve this problem by adjusting the content of the binder or by adding an additive. In most of these techniques, however, the properties of the cured film only immediately after the preparation thereof were evaluated to be improved, failing to show that the stability continues over time.

DISCLOSURE OF INVENTION

Technical Problem

Accordingly, the present invention aims to provide a positive-type photosensitive resin composition in which the production of diol compounds is suppressed in the positive-type photosensitive resin composition that uses a mixed binder comprising an acrylic copolymer and a siloxane copolymer, whereby an appropriate level of developability is maintained when a cured film is prepared, thereby enhancing the pattern adhesiveness, resolution, and sensitivity, as well as a cured film having excellent stability over time at room temperature and low temperatures can be provided, and a cured film prepared therefrom to be used in a liquid crystal display, an organic EL display, and the like.

Solution to Problem

In order to accomplish the above object, the present invention provides a positive-type photosensitive resin composition, which comprises (A) an acrylic copolymer; (B) a siloxane copolymer; (C) a 1,2-quinonediazide compound; and (D) a solvent, wherein the solvent (D) comprises a nonpolar organic solvent having a boiling point of 155 to 200° C. at 25° C. and 1 atm.

In order to achieve another object, the present invention provides a cured film prepared from the photosensitive resin composition.

Advantageous Effects of Invention

The positive-type photosensitive resin composition according to the present invention comprises a nonpolar organic solvent, thereby suppressing the reactivity of the epoxy group in the composition to reduce the production of diol compounds. When a cured film is prepared from the composition, an appropriate level of developability can be maintained to further enhance the pattern adhesiveness, resolution, and sensitivity. Further, since the composition of the present invention has a small difference in the film retention rate at room temperature and low temperatures, the composition can be stable over time.

BEST MODE FOR CARRYING OUT THE INVENTION

The present invention is not limited to those described below. Rather, it can be modified into various forms as long as the gist of the invention is not altered.

Throughout the present specification, when a part is referred to as "comprising" an element, it is understood that other elements may be comprised, rather than other elements are excluded, unless specifically stated otherwise. In addition, all numbers and expressions relating to quantities of components, reaction conditions, and the like used herein are to be understood as being modified by the term "about" unless specifically stated otherwise.

The present invention provides a positive-type photosensitive resin composition, which comprises (A) an acrylic copolymer; (B) a siloxane copolymer; (C) a 1,2-qumonediazide compound; and (D) a solvent. Here, the solvent (D) comprises a nonpolar organic solvent whose boiling point is 155 to 200° C. at 25° C. and 1 atm.

The composition may optionally further comprise (E) a multifunctional monomer; (F) an epoxy compound; (G) a surfactant; (H) an adhesion supplement; and/or (I) a silane compound.

As used herein, the term "(meth)acryl" refers to "acryl" and/or "methacryl," and the term "(meth)acrylate" refers to "acrylate" and/or "methacrylate."

The weight average molecular weight (g/mole or Da) of each component as described below is measured by gel permeation chromatography (GPC, eluent: tetrahydrofuran) referenced to a polystyrene standard.

(A) Acrylic Copolymer

The positive-type photosensitive resin composition according to the present invention may comprise an acrylic copolymer (A) as a binder.

The acrylic copolymer may comprise (a-1) a structural unit derived from an ethylenically unsaturated carboxylic acid, an ethylenically unsaturated carboxylic anhydride, or a combination thereof; (a-2) a structural unit derived from an unsaturated compound containing an epoxy group; and (a-3) a structural unit derived from an ethylenically unsaturated compound different from the structural units (a-1) and (a-2).

The acrylic copolymer is an alkali-soluble resin for materializing developability in the development step and also plays the role of a base for forming a film upon coating and a structure for forming a final pattern.

(a-1) Structural Unit Derived from an Ethylenically Unsaturated Carboxylic Acid, an Ethylenically Unsaturated Carboxylic Anhydride, or a Combination Thereof.

The structural unit (a-1) may be derived from an ethylenically unsaturated carboxylic acid, an ethylenically unsaturated carboxylic anhydride, or a combination thereof.

The ethylenically unsaturated carboxylic acid, the ethylenically unsaturated carboxylic anhydride, or a combination thereof is a polymerizable unsaturated compound containing at least one carboxyl group in the molecule. It may be at least one selected from an unsaturated monocarboxylic acid such as (meth)acrylic acid, crotonic acid, α-chloroacrylic acid, and cinnamic acid; an unsaturated dicarboxylic acid and an anhydride thereof such as maleic acid, maleic anhydride, fumaric acid, itaconic acid, itaconic anhydride, citraconic acid, citraconic anhydride, and mesaconic acid; an unsaturated polycarboxylic acid having three or more valences and an anhydride thereof; and a mono[(meth)acryloyloxyalkyl] ester of a polycarboxylic acid of divalence or more such as mono[2-(meth)acryloyloxyethyl] succinate, mono[2-(meth)acryloyloxyethyl]phthalate, and the like. But it is not limited thereto. (Meth)acrylic acid among the above is preferable from the viewpoint of developability.

The amount of the structural unit (a-1) may be 5 to 50% by mole, preferably 10 to 40% by mole, based on the total moles of the structural units constituting the acrylic copolymer. Within the above range, it is possible to attain a pattern formation of a film while maintaining favorable developability.

(a-2) Structural Unit Derived from an Unsaturated Compound Containing an Epoxy Group The structural unit (a-2) may be derived from an unsaturated monomer containing at least one epoxy group.

Particular examples of the unsaturated monomer containing at least one epoxy group may include glycidyl (meth)acrylate, 4-hydroxybutyl acrylate glycidyl ether, 3,4-epoxybutyl (meth)acrylate, 4,5-epoxypentyl (meth)acrylate, 5,6-epoxyhexyl (meth)acrylate, 6,7-epoxyheptyl (meth)acrylate, 2,3-epoxycyclopentyl (meth)acrylate, 3,4-epoxycyclohexyl (meth)acrylate, α-ethyl glycidyl acrylate, α-n-propyl glycidyl acrylate, α-n-butyl glycidyl acrylate, N-(4-(2,3-epoxypropoxy)-3,5-dimethylbenzyl)acrylamide, N-(4-(2,3-epoxypropoxy)-3,5-dimethylphenylpropyl)acrylamide, allyl glycidyl ether, 2-methylallyl glycidyl ether, and a combination thereof.

The amount of the structural unit derived from an unsaturated compound containing at least one epoxy group (a-2) may be 1 to 45% by mole, preferably 3 to 30% by mole, based on the total number of moles of the structural units constituting the acrylic copolymer. Within the above range, the storage stability of the composition may be maintained, and the film retention rate upon post-bake may be advantageously enhanced.

(a-3) Structural Unit Derived from an Ethylenically Unsaturated Compound Different from the Structural Units (a-1) and (a-2)

The structural unit (a-3) may be derived from an ethylenically unsaturated compound different from the structural units (a-1) and (a-2).

The ethylenically unsaturated compound different from the structural units (b-1) and (b-2) may be at least one selected from the group consisting of an ethylenically unsaturated compound having an aromatic ring such as phenyl (meth)acrylate, benzyl (meth)acrylate, 2-phenoxyethyl (meth)acrylate, phenoxy diethylene glycol (meth)acrylate, p-nonylphenoxy polyethylene glycol (meth)acrylate, p-nonylphenoxy polypropylene glycol (meth)acrylate, tribromophenyl (meth)acrylate, styrene, methylstyrene, dimethylstyrene, trimethylstyrene, ethylstyrene, diethylstyrene, triethylstyrene, propylstyrene, butylstyrene, hexylstyrene, heptylstyrene, octylstyrene, fluorostyrene, chlorostyrene, bromostyrene, iodostyrene, methoxystyrene, ethoxystyrene, propoxystyrene, p-hydroxy-α-methylstyrene, acetylstyrene, vinyl toluene, divinylbenzene, vinylphenol, o-vinylbenzyl methyl ether, m-vinylbenzyl methyl ether, and p-vinylbenzyl methyl ether; an unsaturated carboxylic acid ester such as (meth)acrylate, methyl (meth)acrylate, ethyl (meth)acrylate, butyl (meth)acrylate, dimethylaminoethyl (meth)acrylate, isobutyl (meth)acrylate, t-butyl (meth)acrylate, cyclohexyl (meth)acrylate, ethylhexyl (meth)acrylate, tetrahydrofurfuryl (meth)acrylate, hydroxyethyl (meth)acrylate, 2-hydroxypropyl (meth)acrylate, 2-hydroxy-3-chloropropyl (meth)acrylate, 4-hydroxybutyl (meth)acrylate, glycerol (meth)acrylate, methyl α-hydroxymethylacrylate, ethyl α-hydroxymethylacrylate, propyl α-hydroxymethylacrylate, butyl α-hydroxymethylacrylate, 2-methoxyethyl(meth)acrylate, 3-methoxybutyl (meth)acrylate, ethoxy diethylene glycol (meth)acrylate, methoxy triethylene glycol (meth)acrylate, methoxy tripropylene glycol (meth)acrylate, poly (ethylene glycol) methyl ether (meth)acrylate, tetrafluoropropyl (meth)acrylate, 1,1,1,3,3,3-hexafluoroisopropyl (meth)acrylate, octafluoropentyl (meth)acrylate, heptadecafluorodecyl (meth)acrylate, isobornyl (meth)acrylate, dicyclopentanyl (meth)acrylate, dicyclopentenyl (meth)acrylate, dicyclopentanyloxyethyl (meth)acrylate, and dicyclopentenyloxyethyl (meth)acrylate; an N-vinyl tertiary amine containing an N-vinyl group such as N-vinyl pyrrolidone, N-vinyl carbazole, and N-vinyl morpholine; an unsaturated ether such as vinyl methyl ether and vinyl ethyl ether; and an unsaturated imide such as N-phenylmaleimide, N-(4-chlorophenyl)maleimide, N-(4-hydroxyphenyl)maleimide, and N-cyclohexylmaleimide.

The structural unit (a-3) may comprise a structural unit (a-3-1) represented by the following Formula 1:

[Formula 1]

In the above Formula 1, $R_1$ is $C_{1-4}$ alkyl.

Specifically, the functional group in the structural unit (a-3-1) can freely rotate in the polymer, which allows the penetration of a developer during the development. Thus, a coating film is more readily developed during the development after the exposure to light, thereby securing excellent sensitivity.

The content of the structural unit (a-3-1) may be 1 to 30% by weight, or 2 to 20% by weight, based on the total weight of the acrylic copolymer (A). Within the above range, it is possible to attain a pattern of a coating film with excellent sensitivity.

The structural unit (a-3) may comprise a structural unit (a-3-2) represented by the following Formula 2:

[Formula 2]

In the above Formula 2, $R_2$ and $R_3$ are each independently $C_{1-4}$ alkyl.

As the acrylic copolymer (A) comprises the structural unit (a-3-1) and the structural unit (a-3-2) at the same time, it is advantageous to improving the sensitivity while maintaining the film retention rate.

The content of the structural unit (a-3-2) may be 1 to 30% by weight, or 2 to 20% by weight, based on the total weight of the acrylic copolymer (A).

The structural unit (a-3-1) and the structural unit (a-3-2) may have a content ratio of 1:99 to 80:20, preferably a content ratio of 5:95 to 40:60. Within the above range, it is advantageous to improving the sensitivity while maintaining the film retention rate.

The amount of the structural unit (a-3) may be 0 to 90% by mole, or 50 to 70% by mole, based on the total number of moles of the structural units constituting the acrylic copolymer (A). Within the above amount range, it is possible to control the reactivity of the acrylic copolymer (i.e., an alkali-soluble resin) and to increase the solubility thereof in an aqueous alkaline solution, so that it is possible to remarkably enhance the coatability of the photosensitive resin composition and to form a pattern on the film with good developability.

The acrylic copolymer may be prepared by compounding each of the compounds that provide the structural units (a-1), (a-2), and (a-3), and adding thereto a molecular weight controlling agent, a polymerization initiator, a solvent, and the like, followed by charging nitrogen thereto and slowly stirring the mixture for polymerization. The molecular weight controlling agent may be a mercaptan compound such as butyl mercaptan, octyl mercaptan, lauryl mercaptan, or the like, or an α-methylstyrene dimer, but it is not particularly limited thereto.

The polymerization initiator may be an azo compound such as 2,2'-azobisisobutyronitrile, 2,2'-azobis(2,4-dimethylvaleronitrile), and 2,2'-azobis(4-methoxy-2,4-dimethylvaleronitrile); or benzoyl peroxide; lauryl peroxide; t-butyl peroxypivalate; 1,1-bis(t-butylperoxy)cyclohexane, or the like, but it is not limited thereto. The polymerization initiator may be used alone or in combination of two or more thereof.

In addition, the solvent may be any solvent commonly used in the preparation of an acrylic copolymer. It may preferably be methyl 3-methoxypropionate (MMP) or propylene glycol monomethyl ether acetate (PGMEA).

In particular, it is possible to reduce the residual amount of unreacted monomers by keeping the reaction time longer while maintaining the reaction conditions to be milder during the polymerization reaction.

The reaction conditions and the reaction time are not particularly limited. For example, the reaction temperature may be adjusted to a temperature lower than the conventional temperature, for example, from room temperature to 60° C. or from room temperature to 65° C. Then, the reaction time is to be maintained until a sufficient reaction takes place.

It is possible to reduce the residual amount of unreacted monomers in the acrylic copolymer to a very minute level when the acrylic copolymer is prepared by the above process.

Here, the term unreacted monomers (or residual monomers) of the acrylic copolymer as used herein refers to the amount of the compounds (i.e., monomers) that aim to provide the structural units (a-1) to (a-3) of the acrylic copolymer, but do not participate in the reaction (i.e., do not form a chain of the copolymer).

Specifically, the amount of unreacted monomers of the acrylic copolymer (A) remaining in the photosensitive resin composition of the present invention may be 2 parts by weight or less, preferably 1 part by weight or less, based on 100 parts by weight of the copolymer (on the basis of solids content).

Here, the term solids content refers to the amount of the composition, exclusive of solvents.

The weight average molecular weight (Mw) of the acrylic copolymer (A) may be in the range of 5,000 to 20,000 Da, preferably 8,000 to 13,000 Da. Within the above range, the adhesiveness to a substrate is excellent, the physical and chemical properties are good, and the viscosity is proper.

The acrylic copolymer (A) may be employed in an amount of 10 to 90% by weight, 30 to 80% by weight, or 45 to 65% by weight, based on the total weight of the photosensitive resin composition on the basis of the solids content, exclusive of solvents.

Within the above range, the developability is appropriately controlled, which is advantageous in terms of film retention.

(B) Siloxane Copolymer

The positive-type photosensitive resin composition according to the present invention may comprise a siloxane copolymer as a binder.

The siloxane copolymer has a chemical structure in a complex net shape. The Si—O bond in a siloxane copolymer has a larger decomposition energy than that of the C—C bond in an acrylic copolymer. The siloxane copolymer having such structural characteristics can suppress the thermal flowability of other components having a low molecular weight, such as the linear acrylic copolymer or multifunctional monomer, in the composition when a cured film is formed. In addition, the silanol in the siloxane copolymer improves the binding to the lower substrate, thereby improving the adhesion thereto. It also increases the efficiency of the inhibition with a photoactive compound (PAC), thereby helping to increase the film retention rate.

The siloxane copolymer includes a condensate of a silane compound and/or a hydrolysate thereof. In such event, the silane compound or the hydrolysate thereof may be a monofunctional to tetrafunctional silane compound.

As a result, the siloxane copolymer may comprise a siloxane structural unit selected from the following Q, T, D, and M types:

- Q type siloxane structural unit: a siloxane structural unit comprising a silicon atom and four adjacent oxygen atoms, which may be derived from, e.g., a tetrafunctional silane compound or a hydrolysate of a silane compound that has four hydrolyzable groups.
- T type siloxane structural unit: a siloxane structural unit comprising a silicon atom and three adjacent oxygen atoms, which may be derived from, e.g., a trifunctional silane compound or a hydrolysate of a silane compound that has three hydrolyzable groups.
- D type siloxane structural unit: a siloxane structural unit comprising a silicon atom and two adjacent oxygen atoms (i.e., a linear siloxane structural unit), which may be derived from, e.g., a difunctional silane compound or a hydrolysate of a silane compound that has two hydrolyzable groups.
- M type siloxane structural unit: a siloxane structural unit comprising a silicon atom and one adjacent oxygen atom, which may be derived from, e.g., a monofunctional silane compound or a hydrolysate of a silane compound that has one hydrolyzable group.

For example, the siloxane copolymer may comprise a structural unit derived from a compound represented by the following Formula 3. For example, the siloxane copolymer may be a condensate of a silane compound represented by the following Formula 3 and/or a hydrolysate thereof.

[Formula 3]

In the above Formula 3, n is an integer of 0 to 3, $R_4$ is each independently $C_{1-12}$ alkyl, $C_{2-10}$ alkenyl, $C_{6-15}$ aryl, $C_{3-12}$ heteroalkyl, $C_{4-10}$ heteroalkenyl, or $C_{6-15}$ heteroaryl, and $R_5$ is each independently hydrogen, $C_{1-6}$ alkyl, $C_{2-6}$ acyl, or $C_{6-15}$ aryl, wherein the heteroalkyl, the heteroalkenyl, and the heteroaryl groups each independently have at least one heteroatom selected from the group consisting of O, N, and S.

Examples of the structural unit wherein $R_4$ has a heteroatom include an ether, an ester, and a sulfide.

The compound may be a tetrafunctional silane compound where n is 0, a trifunctional silane compound where n is 1, a difunctional silane compound where n is 2, or a monofunctional silane compound where n is 3.

Particular examples of the silane compound may include, e.g., as the tetrafunctional silane compound, tetraacetoxysilane, tetramethoxysilane, tetraethoxysilane, tetrabutoxysilane, tetraphenoxysilane, tetrabenzyloxysilane, and tetrapropoxysilane; as the trifunctional silane compound, methyltrichlorosilane, methyltrimethoxysilane, methyltriethoxysilane, methyltriisopropoxysilane, methyltributoxysilane, ethyltrimethoxysilane, ethyltriethoxysilane, ethyltriisopropoxysilane, ethyltributoxysilane, butyltrimethoxysilane, pentafluorophenyltrimethoxysilane, phenyltrimethoxysilane, phenyltriethoxysilane, d³-methyltrimethoxysilane, nonafluorobutylethyltrimethoxysilane, trifluoromethyltrimethoxysilane, n-propyltrimethoxysilane, n-propyltriethoxysilane, n-butyltriethoxysilane, n-hexyltrimethoxysilane, n-hexyltriethoxysilane, decyltrimethoxysilane, vinyltrimethoxysilane, vinyltriethoxysilane, 3-methacryloxypropyltrimethoxysilane, 3-methacryloxypropyltriethoxysilane, 3-acryloxypropyltrimethoxysilane, 3-acryloxypropyltriethoxysilane, p-hydroxyphenyltrimethoxysilane, 1-(p-hydroxyphenyl)ethyltrimethoxysilane, 2-(p-hydroxyphenyl)ethyltrimethoxysilane, 4-hydroxy-5-(p-hydroxyphenylcarbonyloxy)pentyltrimethoxysilane, trifluoromethyltriethoxysilane, 3,3,3-trifluoropropyltrimethoxysilane, 3-aminopropyltrimethoxysilane, 3-aminopropyltriethoxysilane, 3-glycidoxypropyltrimethoxysilane, 3-glycidoxypropyltriethoxysilane, 2-(3,4-epoxycyclohexyl)ethyltrimethoxysilane, 2-(3,4-epoxycyclohexyl)ethyltriethoxysilane, [(3-ethyl-3-oxetanyl)methoxy]propyltrimethoxysilane, [(3-ethyl-3-oxetanyl)methoxy]propyltriethoxysilane, 3-mercaptopropyltrimethoxysilane, and 3-trimethoxysilylpropylsuccinic acid; as the difunctional silane compound, dimethyldiacetoxysilane, dimethyldimethoxysilane, dimethyldiethoxysilane, diphenyldiethoxysilane, diphenyldiphenoxysilane, dibutyldimethoxysilane, dimethyldiethoxysilane, (3-glycidoxypropyl)methyldimethoxysilane, (3-glycidoxypropyl)methyldiethoxysilane, 3-(2-aminoethylamino)propyldimethoxymethylsilane, 3-aminopropyldiethoxymethylsilane, 3-chloropropyldimethoxymethylsilane, 3-mercaptopropyldimethoxymethylsilane, cyclohexyldimethoxymethylsilane, diethoxymethylvinylsilane, dimethoxymethylvinylsilane, and dimethoxydi-p-tolylsilane; and as the monofunctional silane compound, trimethylsilane, tributylsilane, trimethylmethoxysilane, tributylethoxysilane, (3-glycidoxypropyl)dimethylmethoxysilane, and (3-glycidoxypropyl)dimethylethoxysilane.

Preferred among the tetrafunctional silane compounds are tetramethoxysilane, tetraethoxysilane, and tetrabutoxysilane; preferred among the trifunctional silane compounds are methyltrimethoxysilane, methyltriethoxysilane, methyltriisopropoxysilane, methyltributoxysilane, phenyltrimethoxysilane, ethyltrimethoxysilane, ethyltriethoxysilane, ethyltriisopropoxysilane, ethyltributoxysilane, and butyltrimethoxysilane; preferred among the difunctional silane compounds are dimethyldimethoxysilane, diphenyldimethoxysilane, diphenyldiethoxysilane, diphenyldiphenoxysilane, dibutyldimethoxysilane, and dimethyldiethoxysilane.

These silane compounds may be used alone or in combination of two or more thereof.

The conditions for obtaining a hydrolysate or a condensate of the silane compound of the above Formula 3 are not particularly limited. For example, the silane compound of Formula 3 is optionally diluted with a solvent such as ethanol, 2-propanol, acetone, butyl acetate, or the like, and water that is essential for the reaction and an acid (e.g., hydrochloric acid, acetic acid, nitric acid, or the like) or a base (e.g., ammonia, triethylamine, cyclohexylamine, tetramethylammonium hydroxide, or the like) as a catalyst are added thereto, followed by stirring the mixture to complete the hydrolytic polymerization reaction, whereby the desired hydrolysate or condensate thereof can be obtained.

The weight average molecular weight of the condensate (i.e., siloxane copolymer) obtained by the hydrolytic polymerization of the silane compound of the above Formula 3 is preferably in a range of 500 to 50,000 Da. Within the above range, it is more preferable in terms of the film formation characteristics, solubility, dissolution rate to a developer, and the like.

The type and amount of the solvent or the acid or base catalyst are not particularly limited. In addition, the hydrolytic polymerization reaction may be carried out at a low temperature of 20° C. or lower. Alternatively, the reaction may be expedited by heating or refluxing.

The required reaction time may be adjusted depending on the type and concentration of the silane structural units, reaction temperature, and the like. For example, it usually takes 15 minutes to 30 days for the reaction to proceed until the molecular weight of the condensate thus obtained becomes approximately 500 to 50,000 Da. But it is not limited thereto.

The siloxane copolymer may comprise a linear siloxane structural unit (i.e., D-type siloxane structural unit). This linear siloxane structural unit may be derived from a difunctional silane compound, for example, a compound represented by the above Formula 3 where n is 2. Particularly, the siloxane copolymer may comprise the structural unit derived from the silane compound of the above Formula 3 where n is 2 in an amount of 0.5 to 50% by mole, preferably 1 to 30% by mole, based on an Si atomic mole number. Within the above content range, it is possible that a cured film may have flexible characteristics while maintaining a certain level of hardness, whereby the crack resistance to an external stress can be further enhanced.

Further, the siloxane copolymer may comprise a structural unit derived from a silane compound represented by the above Formula 3 where n is 1 (i.e., T-type structural unit). Preferably, the siloxane copolymer may comprise the structural unit derived from the silane compound of the above Formula 3 where n is 1 in an amount ratio of 40 to 85% by mole, more preferably 50 to 80% by mole, based on an Si atomic mole number. Within the above content range, it is more advantageous to form a precise pattern profile.

In addition, in consideration of the hardness, sensitivity, and retention rate of a cured film, it is preferable that the siloxane copolymer comprises a structural unit derived from a silane compound having an aryl group. For example, the siloxane copolymer may comprise the structural unit derived from a silane compound having an aryl group in an amount of 30 to 70% by mole, preferably 35 to 50% by mole, based on an Si atomic mole number. Within the above content range, the compatibility of the siloxane copolymer with a 1,2-naphthoquinonediazide compound is excellent, which may prevent an excessive decrease in sensitivity while attaining more favorable transparency of a cured film. The structural unit derived from the silane compound having an aryl group may be a structural unit derived from a silane compound of the above Formula 3 where $R_4$ is an aryl group, preferably a silane compound of the above Formula 3 where n is 1 and $R_4$ is an aryl group, particularly a silane compound of the above Formula 3 where n is 1 and $R_4$ is a phenyl group (i.e., siloxane structural unit of T-phenyl type).

The siloxane copolymer may comprise a structural unit derived from a silane compound represented by the above Formula 3 where n is 0 (i.e., Q-type structural unit). Preferably, the siloxane copolymer may comprise the structural unit derived from the silane compound represented by the above Formula 3 where n is 0 in an amount of 10 to 40% by mole, preferably 15 to 35% by mole, based on an Si atomic mole number. Within the above content range, the photosensitive resin composition may maintain its solubility to an aqueous alkaline solution at a proper level during the formation of a pattern, thereby preventing any defects caused by a reduction in the solubility or a drastic increase in the solubility of the composition.

The term "% by mole based on an Si atomic molar number" as used herein refers to a percentage of the number of moles of Si atoms contained in a specific structural unit with respect to the total number of moles of Si atoms contained in all of the structural units constituting the siloxane polymer.

The molar amount of a siloxane unit in the siloxane copolymer may be measured by the combination of Si-NMR, $^1$H-NMR, $^{13}$C-NMR, IR, TOF-MS, elementary analysis, measurement of ash, and the like. For example, in order to measure the molar amount of a siloxane unit having a phenyl group, an Si-NMR analysis is performed on the entire siloxane copolymer, followed by an analysis of the phenyl-bound Si peak area and the phenyl-unbound Si peak area. The molar amount can then be computed from the peak area ratio between them.

Further, if the siloxane copolymer dissolves too rapidly to a developer during development, there arises a problem that the adhesiveness of a pattern is deteriorated due to the rapid developability. If it dissolves too slowly, there is a problem that the sensitivity is lowered.

Therefore, it is important that the siloxane copolymer has an appropriate level of dissolution rate to a developer. Specifically, when the siloxane copolymer is dissolved in an aqueous solution of 1.5% by weight of tetramethylammonium hydroxide solution at a pre-bake temperature of 105° C., it may have an average dissolution rate (ADR) of 50 Å/sec or more, 100 Å/sec or more, 1,500 Å/sec or more, 100 to 10,000 Å/sec, 100 to 8,000 Å/sec, 100 to 5,000 Å/sec, 1,000 to 5,000 Å/sec, or 1,500 to 5,000 Å/sec. Within the above range, it is more advantageous in terms of sensitivity and resolution upon development.

The photosensitive resin composition may comprise the siloxane copolymer in an amount of 20 to 80 parts by weight, or 30 to 60 parts by weight, based on 100 parts by weight of the acrylic copolymer (A) (on the basis of solids content excluding solvents).

Within the above range, the developability is appropriately controlled, which is advantageous in terms of film retention and resolution.

(C) 1,2-Quinonediazide Compound

The positive-type photosensitive resin composition according to the present invention may comprise a 1,2-quinonediazide-based compound (C).

The 1,2-quinonediazide-based compound may be a compound used as a photosensitive agent in the photoresist field.

Examples of the 1,2-quinonediazide-based compound include an ester of a phenolic compound and 1,2-benzoquinonediazide-4-sulfonic acid or 1,2-benzoquinonediazide-5-sulfonic acid; an ester of a phenolic compound and 1,2-naphthoquinonediazide-4-sulfonic acid or 1,2-naphthoquinonediazide-5-sulfonic acid; a sulfonamide of a phenolic compound in which the hydroxyl group is substituted with an amino group and 1,2-benzoquinonediazide-4-sulfonic acid or 1,2-benzoquinonediazide-5-sulfonic acid; a sulfonamide of a phenolic compound in which the hydroxyl group is substituted with an amino group and 1,2-naphthoquinonediazide-4-sulfonic acid or 1,2-naphthoquinonediazide-5-sulfonic acid. The above compounds may be used alone or in combination of two or more thereof.

Here, examples of the phenolic compound include 2,3,4-trihydroxybenzophenone, 2,4,6-trihydroxybenzophenone, 2,2',4,4'-tetrahydroxybenzophenone, 2,3,3',4-tetrahydroxybenzophenone, 2,3,4,4'-tetrahydroxybenzophenone, bis(2,4-dihydroxyphenyl)methane, bis(p-hydroxyphenyl)methane, tri(p-hydroxyphenyl)methane, 1,1,1-tri(p-hydroxyphenyl)ethane, bis(2,3,4-trihydroxyphenyl)methane, 2,2-bis(2,3,4-trihydroxyphenyl)propane, 1,1,3-tris(2,5-dimethyl-4-hydroxyphenyl)-3-phenylpropane, 4,4'-[1-[4-[1-[4-hydroxyphenyl]-1-methylethyl]phenyl]ethylidene]bisphenol, bis(2,5-dimethyl-4-hydroxyphenyl)-2-hydroxyphenylmethane, 3,3,3',3'-tetramethyl-1,1'-spirobiindene-5,6,7,5',6',7'-hexanol, 2,2,4-trimethyl-7,2',4'-trihydroxyflavane, and the like.

More particular examples of the 1,2-quinonediazide-based compound include an ester of 2,3,4-trihydroxybenzophenone and 1,2-naphthoquinonediazide-4-sulfonic acid, an ester of 2,3,4-trihydroxybenzophenone and 1,2-naphthoquinonediazide-5-sulfonic acid, an ester of 4,4'-(1-(4-(1-(4-hydroxyphenyl)-1-methylethyl]phenyl)ethylidene)bisphenol and 1,2-naphthoquinonediazide-4-sulfonic acid, an ester of 4,4'-[1-[4-[1-[4-hydroxyphenyl]-1-methylethyl]phenyl]ethylidene]bisphenol and 1,2-naphthoquinonediazide-5-sulfonic acid, and the like.

The above compounds may be used alone or in combination of two or more thereof.

If the preferable compounds exemplified above are used, the transparency of the photosensitive resin composition may be enhanced.

The photosensitive resin composition may comprise the 1,2-quinonediazide-based compound in an amount of 2 to 50 parts by weight, or 5 to 30 parts by weight, based on 100 parts by weight of the acrylic copolymer (A) (on the basis of solids content). Within the above content range, a pattern is more readily formed, and it is possible to prevent such defects as a rough surface of a coated film upon the formation thereof and such a pattern shape as scum appearing at the bottom portion of the pattern upon development, and to secure excellent transmittance.

(D) Solvent

The positive-type photosensitive resin composition of the present invention may be prepared in the form of a liquid composition in which the above components are mixed with a solvent. The solvent may be, for example, an organic solvent.

The solvent of the present invention may comprise a nonpolar organic solvent whose boiling point is 155 to 200° C. at 25° C. and 1 atm in order to enhance the developability and film retention rate when a cured film is prepared.

When the epoxy groups in the acrylic copolymer (A) and/or the epoxy compound (F) are reacted with the $H_2O$ molecules in the polysiloxane copolymer (B), diol compounds are produced. As the amount of the diol compounds increases, there is a problem that the developability is excessively increased whereas the adhesiveness is deteriorated (see Schemes 1 and 2).

The use of a nonpolar solvent makes it possible that the activation energy for the transition state of the epoxy group in the composition is maintained relatively higher than the case where a polar solvent is used. Since the reactivity with $H_2O$ generated from the siloxane copolymer (B) is suppressed, it is possible to reduce the production of the diol compounds. In order to prevent the increase in developability and the decrease in adhesiveness due to the increase of the diol compounds, a nonpolar solvent having a boiling point of 155 to 200° C., 160 to 200° C., or 160 to 190° C. at 25° C. and 1 atm may be further employed.

The nonpolar organic solvent may comprise a compound represented by the following Formula 4:

$$R_6O(C_mH_{2m}O)_2R_7 \qquad \text{[Formula 4]}$$

In the above Formula 4, $R_6$ and $R_7$ are each independently hydrogen or $C_1$ alkyl, and m is 2 or 3.

The nonpolar organic solvent may comprise at least one selected from the group consisting of diethylene glycol monomethyl ether, diethylene glycol dimethyl ether, diethylene glycol diethyl ether, diethylene glycol methyl propyl ether, diethylene glycol methyl isopropyl ether, diethylene glycol methyl ethyl ether, dipropylene glycol methyl ether, and dipropylene glycol dimethyl ether. Specifically, it may be diethylene glycol methyl ethyl ether, diethylene glycol diethyl ether, dipropylene glycol dimethyl ether, or diethylene glycol dimethyl ether.

The solvent (D) may comprise the nonpolar organic solvent in an amount of 1 to 30% by weight, 3 to 30% by weight, or 5 to 20% by weight, of based on the total weight of the solvent (D). Within the above range, it can have a proper dissolution rate in the developer, whereby a pattern is readily formed and a stable process margin is secured.

In addition, the composition of the present invention may further comprise a solvent that can dissolve the components of the composition and is chemically stable. For example, the solvent may be alcohols, ethers, glycol ethers, ethylene glycol alkyl ether acetates, diethylene glycol, propylene glycol monoalkyl ethers, propylene glycol alkyl ether acetates, propylene glycol alkyl ether propionates, aromatic hydrocarbons, ketones, esters, or the like.

Particular examples of the solvent include methanol, ethanol, tetrahydrofuran, dioxane, methyl cellosolve acetate, ethyl cellosolve acetate, ethyl acetoacetate, ethylene glycol monomethyl ether, ethylene glycol monoethyl ether, ethylene glycol dimethyl ether, ethylene glycol diethyl ether, propylene glycol dimethyl ether, propylene glycol diethyl ether, diethylene glycol monomethyl ether, diethylene glycol monoethyl ether, diethylene glycol dimethyl ether, diethylene glycol ethyl methyl ether, propylene glycol monomethyl ether, propylene glycol monoethyl ether, propylene glycol

[Reaction Scheme 1]

[Reaction Scheme 2]

monopropyl ether, dipropylene glycol dimethyl ether, dipropylene glycol diethyl ether, propylene glycol methyl ether acetate, propylene glycol ethyl ether acetate, propylene glycol propyl ether acetate, dipropylene glycol methyl ether acetate, propylene glycol butyl ether acetate, toluene, xylene, methyl ethyl ketone, 4-hydroxy-4-methyl-2-pentanone, cyclopentanone, cyclohexanone, 2-heptanone, γ-butyrolactone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 2-methoxypropionate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, N,N-dimethylformamide, N,N-dimethylacetamide, N-methylpyrrolidone, and the like.

Preferred among the above are ethylene glycol alkyl ether acetates, propylene glycol monoalkyl ethers, propylene glycol alkyl ether acetates, ketones and the like. In particular, preferred are propylene glycol monomethyl ether, propylene glycol monoethyl ether, propylene glycol methyl ether acetate, methyl 3-methoxypropionate, 4-hydroxy-4-methyl-2-pentanone, and the like.

The amount of the solvent in the positive-type photosensitive resin composition according to the present invention is not particularly limited. For example, the solvent may be employed such that the solids content is 10 to 90% by weight, 15 to 85% by weight, or 20 to 80% by weight, based on the total weight of the composition.

The term solids content refers to the components that constitute the composition, exclusive of solvents. If the amount of the solvent is within the above range, the coating of the composition can be readily carried out, and the flowability thereof can be maintained at a proper level.

(E) Multifunctional Monomer

The positive-type photosensitive resin composition according to the present invention may further comprise a multifunctional monomer (E).

The multifunctional monomer is a monomer having a small molecular weight and a double bond. Specifically, it may comprise at least one ethylenically unsaturated double bond. More specifically, the multifunctional monomer may comprise a monofunctional or multifunctional ester compound having at least one ethylenically unsaturated double bond. It may preferably be a tri- to octa-functional compound from the viewpoint of developability.

The multifunctional monomer may be at least one selected from the group consisting of ethylene glycol di(meth)acrylate, propylene glycol di(meth)acrylate, diethylene glycol di(meth)acrylate, triethylene glycol di(meth)acrylate, 1,6-hexanediol di(meth)acrylate, polyethylene glycol di(meth)acrylate, polypropylene glycol di(meth)acrylate, glycerin tri(meth)acrylate, trimethylolpropane tri(meth)acrylate, pentaerythritol tri(meth)acrylate, a monoester of pentaerythritol tri(meth)acrylate and succinic acid, pentaerythritol tetra(meth)acrylate, dipentaerythritol penta(meth)acrylate, dipentaerythritol hexa(meth)acrylate, a monoester of dipentaerythritol penta(meth)acrylate and succinic acid, caprolactone-modified dipentaerythritol hexa(meth)acrylate, pentaerythritol triacrylate-hexamethylene diisocyanate (a reaction product of pentaerythritol triacrylate and hexamethylene diisocyanate), tripentaerythritol hepta(meth)acrylate, tripentaerythritol octa(meth)acrylate, and ethylene glycol monomethyl ether acrylate.

Examples of a commercially available multifunctional monomer may include (i) monofunctional (meth)acrylate such as Aronix M-101, M-111, and M-114 manufactured by Toagosei Co., Ltd., KAYARAD T4-110S and T4-120S manufactured by Nippon Kayaku Co., Ltd., and V-158 and V-2311 manufactured by Osaka Yuki Kayaku Kogyo Co., Ltd.; (ii) bifunctional (meth)acrylate such as Aronix M-210, M-240, and M-6200 manufactured by Toagosei Co., Ltd., KAYARAD HDDA, HX-220, and R-604 manufactured by Nippon Kayaku Co., Ltd., and V-260, V-312, and V-335 HP manufactured by Osaka Yuki Kayaku Kogyo Co., Ltd.; and (iii) tri and more functional (meth)acrylate such as Aronix M-309, M-400, M-403, M-405, M-450, M-7100, M-8030, M-8060, and TO-1382 manufactured by Toagosei Co., Ltd., KAYARAD TMPTA, DPHA, DPHA-40H, T-1420, DPCA-20, DPCA-30, DPCA-60, and DPCA-120 manufactured by Nippon Kayaku Co., Ltd., and V-295, V-300, V-360, V-GPT, V-3PA, V-400, and V-802 manufactured by Osaka Yuki Kayaku Kogyo Co., Ltd.

The multifunctional monomer is in general mainly used in the negative type. In the negative type, it acts as a crosslink by light during exposure to light. On the other hand, in the positive type of the present invention, it acts to improve the developability, thereby enhancing the sensitivity.

Specifically, the multifunctional monomer may have a relatively small molecular weight as compared with the binder (i.e., the acrylic copolymer (A) and the siloxane copolymer (B)). The multifunctional monomer, which has a relatively small molecular weight as compared with the binder, is interposed between the binder during development to facilitate the penetration of a developer, thereby improving the sensitivity.

The photosensitive resin composition may comprise the multifunctional monomer in an amount of 1 to 30 parts by weight, or 3 to 20 parts by weight, based on 100 parts by weight of the acrylic copolymer (A) (on the basis of solids content).

Within the above range, the developability can be properly adjusted to secure excellent sensitivity, the surface of a coating film is not rough upon the formation of the coating film, and scum does not occur at the bottom of the film during development. If it is used in an amount smaller than the above range, the sensitivity is not sufficiently enhanced. If it is excessively used, the thermal flowability in the composition is increased during the hard-bake, whereby the resolution of a pattern is deteriorated.

(F) Epoxy Compound

The positive-type photosensitive resin composition according to the present invention may further comprise an epoxy compound. The epoxy compound may increase the internal density of the binder, particularly the siloxane copolymer, to thereby enhance the chemical resistance of a cured film formed therefrom.

The epoxy compound may be a homo-oligomer or a hetero-oligomer of an unsaturated monomer containing at least one epoxy group.

Examples of the unsaturated monomer containing at least one epoxy group may include glycidyl (meth)acrylate, 4-hydroxybutylacrylate glycidyl ether, 3,4-epoxybutyl (meth)acrylate, 4,5-epoxypentyl (meth)acrylate, 5,6-epoxyhexyl (meth)acrylate, 6,7-epoxyheptyl (meth)acrylate, 2,3-epoxycyclopentyl (meth)acrylate, 3,4-epoxycyclohexyl (meth)acrylate, α-ethyl glycidyl acrylate, α-n-propyl glycidyl acrylate, α-n-butyl glycidyl acrylate, N-(4-(2,3-epoxypropoxy)-3,5-dimethylbenzyl)acrylamide, N-(4-(2,3-epoxypropoxy)-3,5-dimethylphenylpropyl)acrylamide, allyl glycidyl ether, 2-methylallyl glycidyl ether, o-vinylbenzyl glycidyl ether, m-vinylbenzyl glycidyl ether, p-vinylbenzyl glycidyl ether, and a mixture thereof.

The epoxy compound may be synthesized by any methods well known in the art.

Examples of the epoxy compound may include glycidyl methacrylate homopolymer and 3,4-epoxycyclohexylmethyl methacrylate homopolymer.

The epoxy compound may further comprise the following structural unit.

Particular examples thereof may include any structural unit derived from styrene; a styrene having an alkyl substituent such as methylstyrene, dimethylstyrene, trimethylstyrene, ethylstyrene, diethylstyrene, triethylstyrene, propylstyrene, butylstyrene, hexylstyrene, heptylstyrene, and octylstyrene; a styrene having a halogen such as fluorostyrene, chlorostyrene, bromostyrene, and iodostyrene; a styrene having an alkoxy substituent such as methoxystyrene, ethoxystyrene, and propoxystyrene; an acetylstyrene such as p-hydroxy-α-methylstyrene; an ethylenically unsaturated compound having an aromatic ring such as divinylbenzene, vinylphenol, o-vinylbenzyl methyl ether, m-vinylbenzyl methyl ether, and p-vinylbenzyl methyl ether; an unsaturated carboxylic acid ester such as methyl (meth)acrylate, ethyl (meth)acrylate, butyl (meth)acrylate, dimethylaminoethyl (meth)acrylate, isobutyl (meth)acrylate, t-butyl (meth)acrylate, cyclohexyl (meth)acrylate, ethylhexyl (meth)acrylate, tetrahydrofurfuryl (meth)acrylate, hydroxyethyl (meth)acrylate, 2-hydroxypropyl (meth)acrylate, 2-hydroxy-3-chloropropyl (meth)acrylate, 4-hydroxybutyl (meth)acrylate, glycerol (meth)acrylate, methyl α-hydroxymethylacrylate, ethyl α-hydroxymethylacrylate, propyl α-hydroxymethylacrylate, butyl α-hydroxymethylacrylate, 2-methoxyethyl (meth)acrylate, 3-methoxybutyl (meth)acrylate, ethoxy diethylene glycol (meth)acrylate, methoxy triethylene glycol (meth)acrylate, methoxy tripropylene glycol (meth)acrylate, poly (ethylene glycol) methyl ether (meth)acrylate, phenyl (meth)acrylate, benzyl (meth)acrylate, 2-phenoxyethyl (meth)acrylate, phenoxy diethylene glycol (meth)acrylate, p-nonylphenoxy polyethylene glycol (meth)acrylate, p-nonylphenoxy polypropylene glycol (meth)acrylate, tetrafluoropropyl (meth)acrylate, 1,1,1,3,3,3-hexafluoroisopropyl (meth)acrylate, octafluoropentyl (meth)acrylate, heptadecafluorodecyl (meth)acrylate, tribromophenyl (meth)acrylate, isobornyl (meth)acrylate, dicyclopentanyl (meth)acrylate, dicyclopentenyl (meth)acrylate, dicyclopentanyloxyethyl (meth)acrylate, and dicyclopentenyloxyethyl (meth)acrylate; a tertiary amine having an N-vinyl group such as N-vinyl pyrrolidone, N-vinyl carbazole, and N-vinyl morpholine; an unsaturated ether such as vinyl methyl ether and vinyl ethyl ether; an unsaturated imide such as N-phenylmaleimide, N-(4-chlorophenyl)maleimide, N-(4-hydroxyphenyl)maleimide, and N-cyclohexylmaleimide. The structural unit derived from the compounds exemplified above may be contained in the epoxy compound alone or in combination of two or more thereof.

The styrene-based compounds among the above compounds may be further preferable in consideration of polymerizability.

In particular, it is more preferable in terms of the chemical resistance that the epoxy compound does not contain a carboxyl group by way of not using a structural unit derived from a monomer containing a carboxyl group among the above.

The structural unit may be employed in an amount of 0 to 70% by mole, preferably 10 to 60% by mole, based on the total number of moles of the structural units constituting the epoxy compound. Within the above content range, it may be more advantageous in terms of the film strength.

The weight average molecular weight of the epoxy compound may preferably be 100 to 30,000 Da. The weight average molecular weight thereof may more preferably be 1,000 to 15,000 Da. If the weight average molecular weight of the epoxy compound is at least 100 Da, the hardness of a cured film may be more favorable. If it is 30,000 Da or less, a cured film may have a uniform thickness, which is suitable for planarizing any steps thereon.

The photosensitive resin composition may comprise the epoxy compound in an amount of 1 to 40 parts by weight, or 4 to 25 parts by weight, based on 100 parts by weight of the acrylic copolymer (A) (on the basis of solids content excluding solvents). Within the above content range, the chemical resistance and adhesiveness may be more favorable.

(G) Surfactant

The positive-type photosensitive resin composition according to the present invention may further comprise a surfactant to enhance its coatability, if desired.

The kind of the surfactant is not particularly limited, but examples thereof include fluorine-based surfactants, silicon-based surfactants, non-ionic surfactants, and the like.

Specific examples of the surfactant may include fluorine- and silicon-based surfactants such as FZ-2122 supplied by Dow Corning Toray Co., Ltd., BM-1000 and BM-1100 supplied by BM CHEMIE Co., Ltd., Megapack F-142 D, F-172, F-173, and F-183 supplied by Dai Nippon Ink Chemical Kogyo Co., Ltd., Florad FC-135, FC-170 C, FC-430, and FC-431 supplied by Sumitomo 3M Ltd., Sufron S-112, S-113, S-131, S-141, S-145, S-382, SC-101, SC-102, SC-103, SC-104, SC-105, and SC-106 supplied by Asahi Glass Co., Ltd., Eftop EF301, EF303, and EF352 supplied by Shinakida Kasei Co., Ltd., SH-28 PA, SH-190, SH-193, SZ-6032, SF-8428, DC-57, and DC-190 supplied by Toray Silicon Co., Ltd.; non-ionic surfactants such as polyoxyethylene alkyl ethers including polyoxyethylene lauryl ether, polyoxyethylene stearyl ether, polyoxyethylene oleyl ether, and the like; polyoxyethylene aryl ethers including polyoxyethylene octylphenyl ether, polyoxyethylene nonylphenyl ether, and the like; and polyoxyethylene dialkyl esters including polyoxyethylene dilaurate, polyoxyethylene distearate, and the like; and organosiloxane polymer KP341 (manufactured by Shin-Etsu Chemical Co., Ltd.), (meth) acrylate-based copolymer Polyflow Nos. 57 and 95 (manufactured by Kyoei Yuji Chemical Co., Ltd.), and the like. They may be used alone or in combination of two or more thereof.

The photosensitive resin composition may comprise the surfactant in an amount of 0.001 to 5 parts by weight, or 0.05 to 2 parts by weight, based on 100 parts by weight of the acrylic copolymer (A) (on the basis of solids content excluding solvents). Within the above content range, the coating and leveling characteristics of the composition may be good.

(H) Adhesion Supplement

The positive-type photosensitive resin composition according to the present invention may further comprise an adhesion supplement to enhance the adhesiveness to a substrate.

The adhesion supplement may have at least one reactive group selected from the group consisting of a carboxyl group, a (meth)acryloyl group, an isocyanate group, an amino group, a mercapto group, a vinyl group, and an epoxy group.

The kind of the adhesion supplement is not particularly limited. It may be at least one selected from the group consisting of trimethoxysilyl benzoic acid, γ-methacryloxypropyltrimethoxysilane, vinyltriacetoxysilane, vinylt- rimethoxysilane, γ-isocyanatopropyltriethoxysilane, γ-glycidoxypropyltrimethoxysilane, γ-glycidoxypropyltriethoxysilane, N-phenylaminopropyltrimethoxysilane, and β-(3,4-epoxycyclohexyl)ethyltrimethoxysilane.

Preferred is γ-glycidoxypropyltrimethoxysilane, γ-glycidoxypropyltriethoxysilane, 3-isocyanate propyl triethoxysilane, or N-phenylaminopropyltrimethoxysilane, which is capable of enhancing the film retention rate and the adhesiveness to a substrate.

The photosensitive resin composition may comprise the adhesion supplement in an amount of 0 to 5 parts by weight, or 0.001 to 2 parts by weight, based on 100 parts by weight of the acrylic copolymer (A) (on the basis of solids content excluding solvents). Within the above content range, the adhesiveness to a substrate may be further enhanced.

(I) Silane Compound

The positive-type photosensitive resin composition of the present invention may comprise at least one silane compound represented by the following Formula 5, particularly, silane monomers of T type and/or Q type, to thereby enhance the chemical resistance during the treatment in the post-processing by reducing highly reactive silanol groups (Si—OH) in the siloxane copolymer, in association with the epoxy compound, for instance, epoxy oligomers.

$(R_8)_l Si(OR_9)_{4-n}$.  [Formula 5]

in the above Formula 5, l is an integer of 0 to 3, $R_8$ is each independently $C_{1-12}$ alkyl, $C_{2-10}$ alkenyl, $C_{6-15}$ aryl, $C_{3-12}$ heteroalkyl, $C_{4-10}$ heteroalkenyl, or $C_{6-15}$ heteroaryl, and $R_9$ is each independently hydrogen, $C_{1-6}$ alkyl, $C_{2-6}$ acyl, or $C_{6-15}$ aryl, wherein the heteroalkyl, the heteroalkenyl, and the heteroaryl groups each independently have at least one heteroatom selected from the group consisting of O, N, and S.

Examples of the structural unit wherein $R_8$ has a heteroatom include an ether, an ester, and a sulfide.

According to the present invention, the compound may be a tetrafunctional silane compound where l is 0, a trifunctional silane compound where l is 1, a difunctional silane compound where l is 2, or a monofunctional silane compound where l is 3.

Particular examples of the silane compound may include, e.g., as the tetrafunctional silane compound, tetraacetoxysilane, tetramethoxysilane, tetraethoxysilane, tetrabutoxysilane, tetraphenoxysilane, tetrabenzyloxysilane, and tetrapropoxysilane; as the trifunctional silane compound, methyltrimethoxysilane, methyltriethoxysilane, methyltriisopropoxysilane, methyltributoxysilane, ethyltrimethoxysilane, ethyltriethoxysilane, ethyltriisopropoxysilane, ethyltributoxysilane, butyltrimethoxysilane, phenyltrimethoxysilane, phenyltriethoxysilane, $d^3$-methyltrimethoxysilane, n-propyltrimethoxysilane, n-propyltriethoxysilane, n-butyltriethoxysilane, n-hexyltrimethoxysilane, n-hexyltriethoxysilane, decyltrimethoxysilane, vinyltrimethoxysilane, vinyltriethoxysilane, 3-methacryloxypropyltrimethoxysilane, 3-methacryloxypropyltriethoxysilane, 3-acryloxypropyltrimethoxysilane, 3-acryloxypropyltriethoxysilane, p-hydroxyphenyltrimethoxysilane, 1-(p-hydroxyphenyl)ethyltrimethoxysilane, 2-(p-hydroxyphenyl)ethyltrimethoxysilane, 4-hydroxy-5-(p-hydroxyphenylcarbonyloxy)pentyltrimethoxysilane, 3-aminopropyltrimethoxysilane, 3-aminopropyltriethoxysilane, 3-glycidoxypropyltrimethoxysilane, 3-glycidoxypropyltriethoxysilane, 2-(3,4-epoxycyclohexyl)ethyltrimethoxysilane, 2-(3,4-epoxycyclohexyl)ethyltriethoxysilane, [(3-ethyl-3-oxetanyl)methoxy]propyltrimethoxysilane, [(3-ethyl-3-oxetanyl)methoxy]propyltriethoxysilane, 3-mercaptopropyltrimethoxysilane, and 3-trimethoxysilylpropylsuccinic acid; as the difunctional silane compound, dimethyldiacetoxysilane, dimethyldimethoxysilane, diphenyldimethoxysilane, diphenyldiethoxysilane, diphenyldiphenoxysilane, dibutyldimethoxysilane, dimethyldiethoxysilane, (3-glycidoxypropyl)methyldimethoxysilane, (3-glycidoxypropyl)methyldiethoxysilane, 3-(2-aminoethylamino)propyldimethoxymethylsilane, 3-aminopropyldiethoxymethylsilane, 3-mercaptopropyldimethoxymethylsilane, cyclohexyldimethoxymethylsilane, diethoxymethylvinylsilane, dimethoxymethylvinylsilane, anddimethoxydi-p-tolylsilane; and as the monofunctional silane compound, trimethylsilane, tributylsilane, trimethylmethoxysilane, tributylethoxysilane, (3-glycidoxypropyl)dimethylmethoxysilane, and (3-glycidoxypropyl)dimethylethoxysilane.

Preferred among the tetrafunctional silane compounds are tetramethoxysilane, tetraethoxysilane, and tetrabutoxysilane; preferred among the trifunctional silane compounds are methyltrimethoxysilane, methyltriethoxysilane, methyltriisopropoxysilane, methyltributoxysilane, phenyltrimethoxysilane, ethyltrimethoxysilane, ethyltriethoxysilane, ethyltriisopropoxysilane, ethyltributoxysilane, butyltrimethoxysilane, 3-glycidoxypropyltrimethoxysilane, 3-glycidoxypropyltriethoxysilane, 2-(3,4-epoxycyclohexyl)ethyltrimethoxysilane, and 2-(3,4-epoxycyclohexyl)ethyltriethoxysilane; preferred among the difunctional silane compounds are dimethyldimethoxysilane, diphenyldimethoxysilane, diphenyldiethoxysilane, diphenyldiphenoxysilane, dibutyldimethoxysilane, and dimethyldiethoxysilane.

These silane compounds may be used alone or in combination of two or more thereof.

The photosensitive resin composition may comprise the silane compound in an amount of 0 to 50 parts by weight, or 3 to 12 parts by weight, based on 100 parts by weight of the acrylic copolymer (A) (on the basis of solids content excluding solvents). Within the above content range, the chemical resistance of a cured film to be formed may be further enhanced.

In addition, the positive-type photosensitive resin composition of the present invention may comprise other additives such as an antioxidant and a stabilizer as long as the physical properties of the colored photosensitive resin composition are not adversely affected.

Further, the present invention provides a cured film formed from the positive-type photosensitive resin composition.

The cured film may be formed by a method known in the art, for example, a method in which the photosensitive resin composition is coated on a substrate and then cured.

More specifically, in the curing step, the photosensitive resin composition coated on a substrate may be subjected to pre-bake at a temperature of, for example, 60 to 130° C. to remove solvents; then exposed to light using a photomask having a desired pattern; and subjected to development using a developer, for example, a tetramethylammonium hydroxide (TMAH) solution to form a pattern on the coating layer. Thereafter, the patterned coating layer, if necessary, is subjected to post-bake, for example, at a temperature of 150 to 300° C. for 10 minutes to 5 hours to prepare a desired cured film. The exposure to light may be carried out at an exposure rate of 10 to 200 mJ/cm², or 10 to 300 mJ/cm², based on a wavelength of 365 nm in a wavelength band of 200 to 500 nm. According to the process of the present invention, it is possible to easily form a desired pattern from the viewpoint of the process.

The coating of the photosensitive resin composition onto a substrate may be carried out by a spin coating method, a slit coating method, a roll coating method, a screen printing method, an applicator method, or the like, in a desired thickness of, e.g., 2 to 25 µm. In addition, as a light source used for the exposure (irradiation), a low-pressure mercury lamp, a high-pressure mercury lamp, an extra high-pressure mercury lamp, a metal halide lamp, an argon gas laser, or the like may be used. X-ray, electronic ray, or the like may also be used, if desired.

Meanwhile, the photosensitive resin composition may be subjected to photobleaching at an energy of 300 to 2,000 $mJ/cm^2$ or 500 to 1,500 $mJ/cm^2$ after the exposure to light and development to obtain a more transparent cured film. Specifically, the composition may be coated on a substrate and subjected to the exposure to light and development steps, followed by photobleaching and hard-bake thereof to form a cured film. The photobleaching step removes the $N_2$ bonds of the 1,2-quinonediazide-based compound, which is one of the major components of the positive-type photosensitive resin composition, thereby forming a transparent cured film. If the hard-bake is carried out without the photobleaching step, a reddish cured film is obtained, so that the transmittance in the region of, for example, 400 to 600 nm is deteriorated.

The positive-type photosensitive resin composition of the present invention is capable of forming a cured film having excellent pattern adhesiveness and film retention rate upon development. In addition, the composition of the present invention is capable of forming a cured film having excellent resolution and sensitivity.

Figure 1:
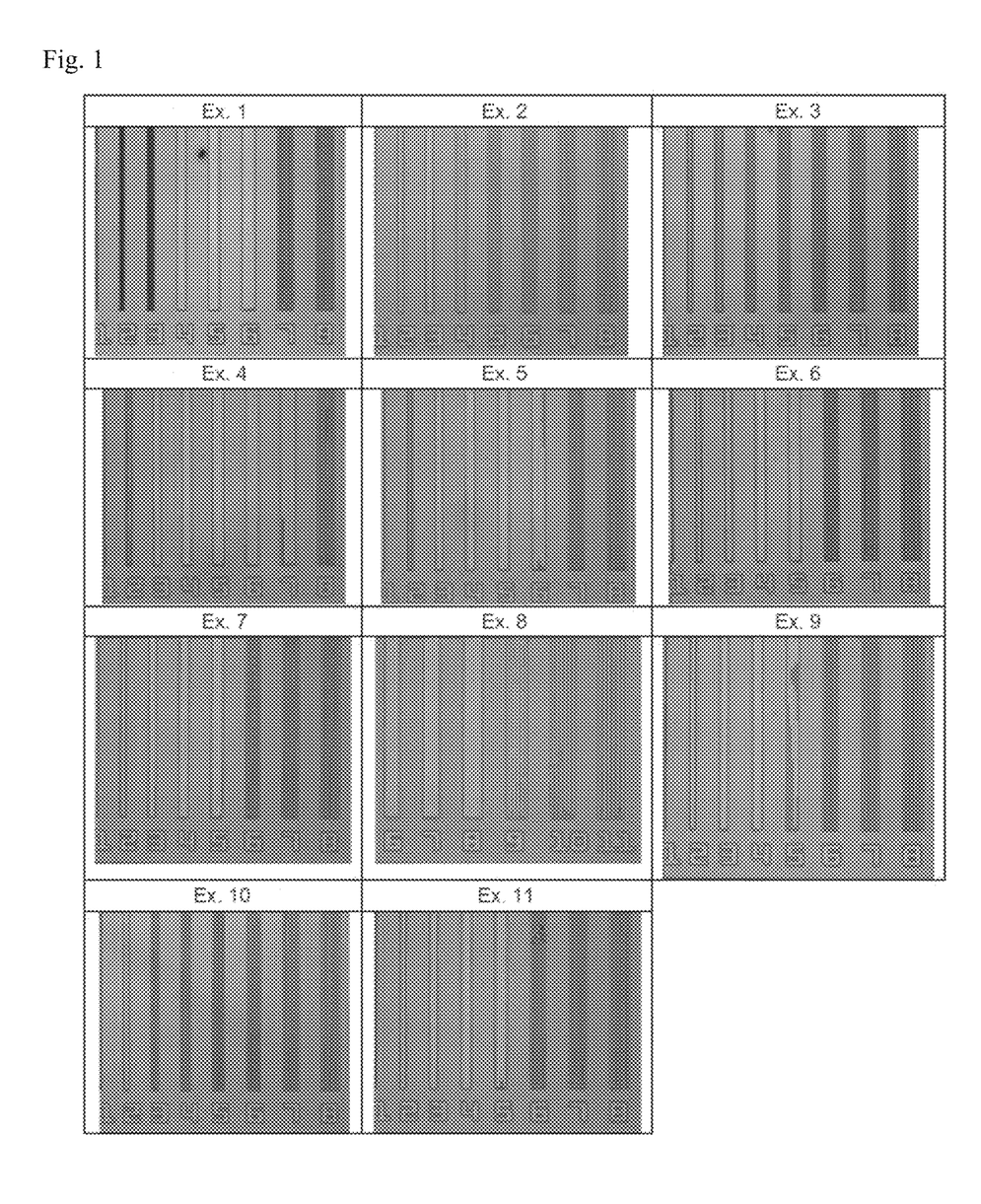
FIG. 1 is microscopic photographs showing the line patterns remaining after the development of the cured films prepared in Examples 1 to 11.
Figure 2:
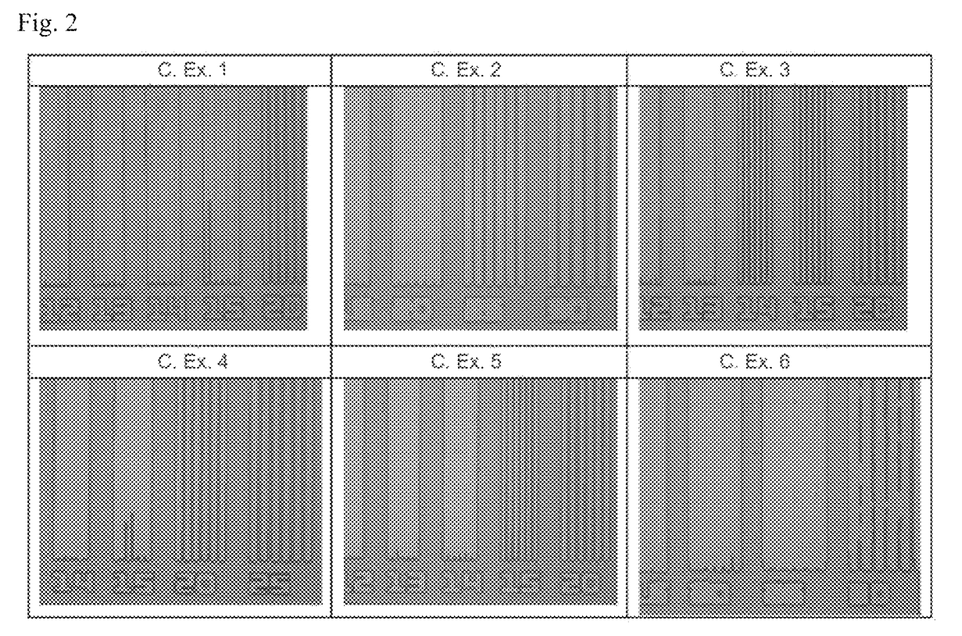
FIG. 2 is microscopic photographs showing the line patterns remaining after the development of the cured films prepared in Comparative Examples 1 to 4.

Specifically, the cured film can implement a line pattern having a fine critical dimension (i.e., small critical dimension) even upon development (i.e., excellent adhesiveness) and a good film retention rate of 5% or less, 4% or less, 0.1 to 5%, or 0.1 to 4% at a thickness of 2.1 µm (see Evaluation Examples 1 and 2).

As described above, the positive-type photosensitive resin composition comprises a nonpolar organic solvent, thereby suppressing the reactivity of the epoxy group in the composition to reduce the production of diol compounds. When a cured film is prepared from the composition, an appropriate level of developability can be maintained to further enhance the pattern adhesiveness, resolution, and sensitivity. Further, since the composition of the present invention has a small difference in the film retention rate at room temperature and low temperatures, the composition may be stable over time. Thus, the cured film prepared therefrom can be advantageously used in a liquid crystal display, an organic EL display, and the like.

MODE FOR THE INVENTION

Hereinafter, the present invention will be described in more detail with reference to the following examples. However, these examples are provided to illustrate the present invention, and the scope of the present invention is not limited thereto only. In the following preparation examples, the weight average molecular weight is determined by gel permeation chromatography (GPC, eluent: tetrahydrofuran) referenced to a polystyrene standard.

EXAMPLE

Preparation Example 1: Synthesis of an Acrylic Copolymer (A-1)

A flask equipped with a cooling tube and a stirrer was charged with 200 parts by weight of propylene glycol monomethyl ether acetate (PGMEA) as a solvent, and the temperature of the solvent was raised to 70° C. while the solvent was stirred slowly. Subsequently, added thereto were 19.8 parts by weight of styrene (Sty), 25.7 parts by weight of methyl methacrylate (MMA), 27.1 parts by weight of glycidyl methacrylate (GMA), 15.6 parts by weight of methacrylic acid (MAA), and 11.7 parts by weight of methyl acrylate (MA). Next, 3 parts by weight of 2,2'-azobis(2,4-dimethylvaleronitrile) as a radical polymerization initiator was added thereto dropwise over 5 hours to carry out a polymerization reaction. The weight average molecular weight of the copolymer thus obtained (solids content: 32% by weight) was 9,000 to 11,000 Da.

Preparation Example 2: Synthesis of an Acrylic Copolymer (A-2)

An acrylic copolymer (A-2) was prepared in the same manner as in Preparation Example 1, except that 200 parts by weight of methyl 3-methoxypropionate was used as a solvent. The weight average molecular weight of the copolymer thus obtained (solids content: 32% by weight) was 9,000 to 11,000 Da.

Preparation Example 3: Preparation of a Siloxane Copolymer (B)

To a reactor equipped with a reflux condenser, 20% by weight of phenyltrimethoxysilane (PhTMOS), 30% by weight of methyltrimethoxysilane (MTMOS), 20% by weight of tetraethoxysilane (TEOS), and 15% by weight of deionized water (DI water) were added, and then 15% by weight of PGMEA were added thereto. Then, the mixture was vigorously stirred while refluxed in the presence of 0.1% by weight of an oxalic acid catalyst for 0.1 hours. Then, the mixture was cooled and diluted with PGMEA such that the solids content was 30% by weight, thereby obtaining a siloxane copolymer (B). The weight average molecular weight of the copolymer thus obtained (solids content: 30% by weight) was 6,000 to 11,000 Da.

In addition, when the copolymer thus obtained was dissolved in an aqueous solution of 1.5% by weight of tetramethylammonium hydroxide at about 110° C., the average dissolution rate (ADR) was 4,113 Å/sec.

Preparation Example 4: Preparation of an Epoxy Compound (F)

A three-necked flask was equipped with a cooling tube and placed on a stirrer equipped with a thermostat. The flask was charged with 100 parts by weight of a monomer composed of 100% by mole of cyclohexylmethyl methacrylate, 10 parts by weight of 2,2'-azobis(2-methylbutyronitrile), and 100 parts by weight of propylene glycol monomethyl ether acetate (PGMEA), followed by charging nitrogen thereto. Thereafter, the temperature of the solution was raised to 80° C. while the solution was slowly stirred, and the temperature was maintained for 5 hours. Then, PGMEA was added such that the solids content was 20% by weight, thereby obtaining an epoxy compound having a weight average molecular weight of 3,000 to 6,000 Da.

Examples and Comparative Examples: Preparation of Positive-Type Photosensitive Resin Compositions The photosensitive resin compositions of the following Examples and Comparative Examples were each prepared using the compounds prepared in the above Preparation Examples.

The components used in the following Examples and Comparative Examples are as follows.

TABLE 1

| Component | | Compound and/or brand name | Manufacturer | Solids content (% by weight) |
|---|---|---|---|---|
| Acrylic copolymer (A) | A-1 | Preparation Example 1 | — | 32 |
| | A-2 | Preparation Example 2 | — | 32 |
| Siloxane copolymer (B) | | Preparation Example 3 | — | 30 |
| 1,2-quinonediazide compound (C) | C-1 | THA-523 | Miwon | 100 |
| | C-2 | TPA-523 | Miwon | 100 |
| Solvent (D) | D-1 | Propylene glycol monomethyl ether acetate (PGMEA), b.p.: 146° C. | Chemtronix | — |
| | D-2 | Methyl 3-methoxypropionate (MMP), b.p.: 142-143° C. | Chemtronix | — |
| | D-3 | Diethylene glycol methyl ethyl ether (MEDG), b.p.: 179° C. | Chemtronix | — |
| | D-4 | Diethylene glycol diethyl ether (DEDG), b.p.: 188° C. | TCI | — |
| | D-5 | Dipropylene glycol dimethyl ether (DPGDME), b.p.: 175° C. | Aldrich | — |
| | D-6 | Diethylene glycol dimethyl ether (DMDG), b.p.: 162° C. | Aldrich | — |
| | D-7 | γ-butyrolactone (GBL), b.p.: 204° C. | Aldrich | — |
| | D-8 | 3-methoxybutyl acetate (3-MBA), b.p.: 175° C. | Aldrich | — |
| | D-9 | Ethyl 3-ethoxypropionate (EEP), b.p.: 170° C. | Chemtronix | — |
| | D-10 | Ethyl lactate (EL), b.p.: 154° C. | Aldrich | — |
| Multifunctional monomer (E) | | Dipentaerythritol hexa(meth)acrylate (DPHA) | Nippon Kayaku | 100 |
| Epoxy compound (F) | | Preparation Example 4 | — | 20 |
| Surfactant (G) | | Silicone-based leveling surfactant, FZ-2122 | Dow Corning Toray | 100 |

Example 1: Preparation of a Photosensitive Resin Composition

A reactor was charged with 26% by weight of the acrylic copolymer (A-1) of Preparation Example 1 based on the total weight of the photosensitive resin composition excluding the solvents in a balanced amount. In addition, charged thereto were 57.5 parts by weight of the siloxane copolymer (B) of Preparation Example 3, 18.1 parts by weight and 7.6 parts by weight of the 1,2, quinonediazide compounds (C-1) and (C-2), respectively, and 6.6 parts by weight of the epoxy compound (F) of Preparation Example 4, based on 100 parts by weight of the acrylic copolymer (A) (on the basis of solids content). In addition, 0.5% by weight of the surfactant was added based on the total weight of the composition. Then, 45.5% by weight of the solvent (D-1), 5.1% by weight of the solvent (D-2), and 10% by weight of the solvent (D-3) were mixed therewith such that the solids content was 18.5% by weight. After 3 hours, the mixed solution was filtered through a membrane filter having a pore size of 0.2 μm to obtain a composition solution having a solids content of 18.5% by weight.

Examples 2 to 11 and Comparative Examples 1 to 6: Preparation of Photosensitive Resin Compositions Photosensitive resin composition solutions were each prepared in the same manner as in Example 1, except that the kinds and/or contents of the respective components were changed as shown in Tables 2 and 3 below.

TABLE 2

| | Acrylic copolymer (A) | | Siloxane copolymer | 1,2-quinonediazide compound (C) | | Multi-functional monomer | Epoxy comp'd | Surfactant |
|---|---|---|---|---|---|---|---|---|
| | A-1 | A-2 | B | C-1 | C-2 | E | F | G |
| Ex. 1 | 100 | — | 57.5 | 18.1 | 7.6 | — | 6.6 | 0.5 |
| Ex. 2 | 100 | — | 57.5 | 18.1 | 7.6 | — | 6.6 | 0.5 |
| Ex. 3 | 100 | — | 57.5 | 18.1 | 7.6 | — | 6.6 | 0.5 |
| Ex. 4 | 100 | — | 58.5 | 12.3 | 11.5 | 8.0 | 8.3 | 0.5 |

TABLE 2-continued

|  | Acrylic copolymer (A) | | Siloxane copolymer | 1,2-quinonediazide compound (C) | | Multi-functional monomer | Epoxy comp'd | Surfactant |
| --- | --- | --- | --- | --- | --- | --- | --- | --- |
|  | A-1 | A-2 | B | C-1 | C-2 | E | F | G |
| Ex. 5 | 100 | — | 58.5 | 12.3 | 11.5 | 8.0 | 8.3 | 0.5 |
| Ex. 6 | 100 | — | 58.5 | 12.3 | 11.5 | 8.0 | 8.3 | 0.5 |
| Ex. 7 | 100 | — | 58.5 | 12.3 | 11.5 | 8.0 | 8.3 | 0.5 |
| Ex. 8 | 100 | — | 58.5 | 12.3 | 11.5 | 8.0 | 8.3 | 0.5 |
| Ex. 9 | 100 | — | 58.5 | 12.3 | 11.5 | 8.0 | 8.3 | 0.5 |
| Ex. 10 | — | 100 | 57.5 | 18.1 | 7.6 | — | 6.6 | 0.5 |
| Ex. 11 | — | 100 | 58.5 | 19.2 | 8.1 | 8.1 | 8.3 | 0.5 |
| C. Ex. 1 | 100 | — | 57.5 | 18.1 | 7.6 | — | 6.6 | 0.5 |
| C. Ex. 2 | 100 | — | 58.5 | 11.8 | 11.0 | — | 8.3 | 0.5 |
| C. Ex. 3 | 100 | — | 58.5 | 19.2 | 8.1 | 8.1 | 8.3 | 0.5 |
| C. Ex. 4 | — | 100 | 57.5 | 18.1 | 7.6 | — | 6.6 | 0.5 |
| C. Ex. 5 | — | 100 | 57.5 | 18.1 | 7.6 | — | 6.6 | 0.5 |
| C. Ex. 6 | — | 100 | 57.5 | 18.1 | 7.6 | — | 6.6 | 0.5 |

TABLE 3

| (%) | Solvent (D) | | | | | | | | | |
| --- | --- | --- | --- | --- | --- | --- | --- | --- | --- | --- |
|  | D-1 | D-2 | D-3 | D-4 | D-5 | D-6 | D-7 | D-8 | D-9 | D-10 |
| Ex. 1 | 65.0 | 25.0 | 10.0 | — | — | — | — | — | — | — |
| Ex. 2 | 55.0 | 25.0 | 20.0 | — | — | — | — | — | — | — |
| Ex. 3 | 45.0 | 25.0 | 30.0 | — | — | — | — | — | — | — |
| Ex. 4 | 65.0 | 30.0 | 5.0 | — | — | — | — | — | — | — |
| Ex. 5 | 60.0 | 30.0 | 10.0 | — | — | — | — | — | — | — |
| Ex. 6 | 50.0 | 30.0 | 20.0 | — | — | — | — | — | — | — |
| Ex. 7 | 50.0 | 30.0 | — | 20.0 | — | — | — | — | — | — |
| Ex. 8 | 50.0 | 30.0 | — | — | 20.0 | — | — | — | — | — |
| Ex. 9 | 40.0 | 30.0 | — | — | 30.0 | — | — | — | — | — |
| Ex. 10 | 70.0 | — | 30.0 | — | — | — | — | — | — | — |
| Ex. 11 | 70.0 | — | — | — | — | 30.0 | — | — | — | — |
| C. Ex. 1 | 75.0 | 25.0 | — | — | — | — | — | — | — | — |
| C. Ex. 2 | 40.0 | 30.0 | — | — | — | — | 30.0 | — | — | — |
| C. Ex. 3 | 75.0 | 25.0 | — | — | — | — | — | — | — | — |
| C. Ex. 4 | 70.0 | — | — | — | — | — | — | 30.0 | — | — |
| C. Ex. 5 | 70.0 | — | — | — | — | — | — | — | 30.0 | — |
| C. Ex. 6 | 70.0 | — | — | — | — | — | — | — | — | 30.0 |

EVALUATION EXAMPLE

Evaluation Example 1: Evaluation of Film Retention Rate

The compositions prepared in the Examples and the Comparative Examples were each stored at −20° C. and 25° C. (i.e., room temperature) for two days. After two days, the compositions were each coated onto a glass substrate by spin coating. It was then pre-baked on a hot plate kept at 105° C. for 105 seconds to form a dry film. It was developed with an aqueous developer of 2.38% by weight of tetramethylammonium hydroxide through puddle nozzles at 23° C. for 85 seconds. Thereafter, the developed film was subjected to photobleaching by exposing it to light at an exposure rate of 200 mJ/cm² based on a wavelength of 365 nm for a certain time period using an aligner (model name: MA6) that emits light having a wavelength of 200 nm to 450 nm. The exposed film thus obtained was heated in a convection oven at 240° C. for 20 minutes to prepare a cured film having a thickness of 2.1 μm. The film retention rate (FR; %) was obtained from the following equation by calculating the ratio in a percent of the thickness of the film upon the post-bake to that of the film upon the pre-bake by using a measuring instrument (SNU Precision).

Film retention rate(FR,%)=(film thickness upon post-bake/film thickness upon pre-bake)×100   [Equation]

The larger the film retention rate, the better.

In addition, when the difference in film retention rates at −20° C. and 25° C. ($FR_{25}-FR_{-20}$) is 5% or less, the change in film retention rate over time is small; thus, it is evaluated as stable.

Evaluation Example 2: Evaluation of Pattern Adhesiveness

In order to evaluate the adhesiveness of a pattern upon development, a cured film was formed on a substrate irradiated with extreme ultra-violet (EUV) in the following manner, and the adhesion of the pattern was then evaluated.

First, a silicon nitride substrate was exposed for 10 minutes to EUV using a UV lamp (model name: UV-CB8X10) having a power of 8 W at a wavelength of 185 nm and 254 nm. In such event, the spacing between the exposure reference lamp and the substrate was 10 mm. Upon the exposure to light, it was cleaned for 10 seconds with a developer, which was an aqueous solution of 1.4% by weight of tetramethylammonium hydroxide, through spray nozzles at 23° C., thereby preparing a treated silicon nitride substrate. Upon the treatment with EUV, the DI contact angle was in the range of 0 to 3°.

Next, the compositions of the Examples and Comparative Examples stored at 25° C. (room temperature) for two days were each coated onto a glass substrate by spin coating. It was then pre-baked on a hot plate kept at 90° C. for 105 seconds, thereby forming a dry film. A photomask having six 1:3 line patterns each ranging from 1 μm to 30 μm at an interval of 1 μm was placed on the dried film. The film was then exposed to light at an exposure rate of 400 mJ/cm$^2$ based on a wavelength of 365 nm for a certain time period using an aligner (model name: MA6) that emits light having a wavelength of 200 nm to 450 nm. In such event, the spacing between the mask and the substrate was 25 μm. Upon the exposure to light, it was developed for 80 seconds with a developer, which was an aqueous solution of 2.38% by weight of tetramethylammonium hydroxide, through puddle nozzles at 23° C. Thereafter, the developed film was subjected to photobleaching by exposing it to light at an exposure rate of 200 mJ/cm$^2$ based on a wavelength of 365 nm for a certain time period using an aligner (model name: MA6) that emits light having a wavelength of 200 nm to 450 nm. The exposed film thus obtained was heated in a convection oven at 230° C. for 30 minutes to prepare a cured film having a thickness of 2 μm.

Figure 3:
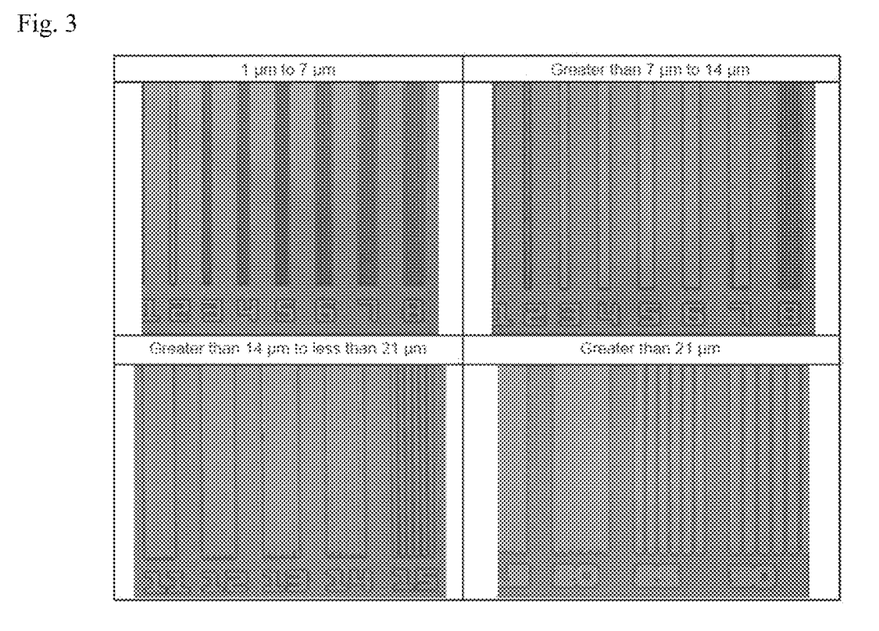
FIG. 3 is microscopic photographs showing the various line patterns formed on the cured films, indicating the grade criteria for evaluating the adhesiveness.

Then, the extent of the smallest line pattern remaining in the line patterns of 1 μm to 30 μm on the silicon nitride substrate was observed using a microscope. Specifically, during the microscopic observation, the size of the smallest line pattern remaining after the line patterns had been detached with the mask critical dimension (CD; μm) was measured and evaluated in accordance with the following criteria. The smaller the size of the minimum residual line pattern, the better the adhesiveness upon development.

[Grade] 1 μm to 7 μm: A, greater than 7 μm to 14 μm: B, greater than 14 μm to less than 21 μm: C, and greater than 21 μm: D patterns having a small size of less than 10 μm remained upon development, indicating their excellent adhesiveness.

In contrast, in the cured films prepared from the compositions of the Comparative Examples, the difference in film retention rates at room temperature and low temperatures was 5% or more, even 11.8% to the maximum, indicating that the stability over time was poor. The line patterns remaining upon development had a size of 16.5 to 30 μm, indicating that they are disadvantageous in terms of adhesiveness.

The invention claimed is:

1. A positive-type photosensitive resin composition, which comprises:
   (A) an acrylic copolymer;
   (B) a siloxane copolymer;
   (C) a 1,2-quinonediazide compound; and
   (D) a solvent,
   wherein the solvent (D) comprises a nonpolar organic solvent whose boiling point is 155 to 200° C. at 25° C. and 1 atm,
   wherein the nonpolar organic solvent comprises a compound represented by the following Formula 4:

$$R_6O(C_mH_{2m}O)_2R_7 \qquad \text{[Formula 4]}$$

in the above Formula 4, $R_6$ and $R_7$ are each independently hydrogen or $C_{1-4}$ alkyl, and m is 2 or 3,
   wherein the solvent (D) comprises the nonpolar organic solvent in an amount of 1 to 30% by weight of based on the total weight of the solvent (D).

2. The positive-type photosensitive resin composition of claim 1, wherein the acrylic copolymer (A) comprises (a-1) a structural unit derived from an ethylenically unsaturated carboxylic acid, an ethylenically unsaturated carboxylic anhydride, or a combination thereof; (a-2) a structural unit

TABLE 4

|  | Stored for two days at −20° C. | | | Stored for two days at 25° C. | | | Difference in film retention | Adhesiveness (after two days) | |
|---|---|---|---|---|---|---|---|---|---|
|  | Initial thickness (μm) | Final thickness (μm) | FR$_{-20}$ (%) | Initial thickness (μm) | Final thickness (μm) | FR$_{25}$ (%) | rate (FR$_{25}$ − FR$_{-20}$) (%) | Line (μm) | Grade |
| Ex. 1 | 28,460 | 20,818 | 73.1 | 28,305 | 20,024 | 70.7 | 2.4 | 7 | A |
| Ex. 2 | 28,309 | 20,593 | 72.7 | 28,309 | 20,243 | 71.5 | 1.2 | 5.3 | A |
| Ex. 3 | 28,139 | 19,088 | 67.8 | 28,013 | 18,982 | 67.8 | 0.1 | 3.3 | A |
| Ex. 4 | 27,920 | 21,063 | 75.4 | 26,384 | 18,663 | 70.7 | 4.7 | 8.5 | B |
| Ex. 5 | 28,862 | 21,200 | 73.5 | 27,992 | 20,007 | 71.5 | 2.0 | 7.1 | B |
| Ex. 6 | 29,811 | 21,581 | 72.4 | 29,001 | 20,581 | 71.0 | 1.4 | 6.2 | A |
| Ex. 7 | 30,533 | 21,884 | 71.7 | 29,533 | 20,804 | 70.4 | 1.2 | 5.9 | A |
| Ex. 8 | 34,533 | 18,884 | 54.7 | 33,772 | 17,243 | 51.1 | 3.6 | 9 | B |
| Ex. 9 | 37,037 | 18,102 | 48.9 | 37,614 | 17,420 | 46.3 | 2.6 | 4.3 | A |
| Ex. 10 | 30,907 | 21,485 | 69.5 | 31,471 | 21,496 | 68.3 | 1.2 | 3 | A |
| Ex. 11 | 28,911 | 19,099 | 66.1 | 29,001 | 18,671 | 64.4 | 1.7 | 6.1 | A |
| C. Ex. 1 | 28,733 | 21,277 | 74.1 | 28,581 | 19,489 | 68.2 | 5.9 | 18 | C |
| C. Ex. 2 | 30,605 | 16,457 | 53.8 | 30,221 | 14,272 | 47.2 | 6.5 | 30 | D |
| C. Ex. 3 | 36,276 | 27,097 | 74.7 | 36,048 | 24,492 | 67.9 | 6.8 | 14.5 | C |
| C. Ex. 4 | 34,527 | 23,998 | 69.5 | 34,498 | 21,998 | 63.8 | 5.7 | 17.2 | C |
| C. Ex. 5 | 33,519 | 23,007 | 68.6 | 34,987 | 21,352 | 61.0 | 7.6 | 16.5 | C |
| C. Ex. 6 | 30,229 | 17,887 | 59.2 | 30,003 | 14,199 | 47.3 | 11.8 | 28 | D |

As shown in Table 4, the cured films prepared from the compositions of the Examples falling within the scope of the present invention had excellent film retention rates at low temperatures as well as at room temperature. The difference in them was very small of 5% or lower, indicating that the stability over time was excellent. In addition, in the cured films prepared from the compositions of the Examples, line derived from an unsaturated compound containing an epoxy group; and (a-3) a structural unit derived from an ethylenically unsaturated compound different from the structural units (a-1) and (a-2).

3. The positive-type photosensitive resin composition of claim 2, wherein the structural unit (a-3) comprises a structural unit (a-3-1) represented by the following Formula 1:

[Formula 1]

in the above Formula 1, $R_1$ is $C_{1-4}$ alkyl.

4. The positive-type photosensitive resin composition of claim 3, wherein the structural unit (a-3) comprises a structural unit (a-3-2) represented by the following Formula 2:

[Formula 2]

in the above Formula 2, $R_2$ and $R_3$ are each independently $C_{1-4}$ alkyl.

5. The positive-type photosensitive resin composition of claim 4, wherein the structural unit (a-3-1) and the structural unit (a-3-2) have a content ratio of 1:99 to 80:20.

6. The positive-type photosensitive resin composition of claim 1, wherein the siloxane copolymer (B) comprises a structural unit derived from a silane compound represented by the following Formula 3:

3 in the above Formula 3, n is an integer of 0 to 3;

$R_4$ is each independently $C_{1-12}$ alkyl, $C_{2-10}$ alkenyl, $C_{6-15}$ aryl, $C_{3-12}$ heteroalkyl, $C_{4-10}$ heteroalkenyl, or $C_{6-15}$ heteroaryl; and $R_5$ is each independently hydrogen, $C_{1-6}$ alkyl, $C_{2-6}$ acyl, or $C_{6-15}$ aryl, wherein the heteroalkyl, the heteroalkenyl, and the heteroaryl groups each independently have at least one heteroatom selected from the group consisting of O, N, and S.

7. The positive-type photosensitive resin composition of claim 1, which comprises the siloxane copolymer (B) in an amount of 20 to 80 parts by weight based on 100 parts by weight of the acrylic copolymer (A).

8. The positive-type photosensitive resin composition of claim 1, wherein the nonpolar organic solvent comprises at least one selected from the group consisting of diethylene glycol monomethyl ether, diethylene glycol dimethyl ether, diethylene glycol diethyl ether, diethylene glycol methyl propyl ether, diethylene glycol methyl isopropyl ether, diethylene glycol methyl ethyl ether, dipropylene glycol methyl ether, and dipropylene glycol dimethyl ether.

9. The positive-type photosensitive resin composition of claim 1, which further comprises a multifunctional monomer.

10. The positive-type photosensitive resin composition of claim 9, wherein the multifunctional monomer is a tri- to octa-functional compound.

11. The positive-type photosensitive resin composition of claim 9, wherein the multifunctional monomer comprises an ethylenically unsaturated double bond.

12. The positive-type photosensitive resin composition of claim 9, which comprises the multifunctional monomer in an amount of 1 to 30 parts by weight based on 100 parts by weight of the acrylic copolymer (A).

13. The positive-type photosensitive resin composition of claim 1, which further comprises an epoxy compound.

* * * * *